(12) United States Patent
Zhang et al.

(10) Patent No.: US 7,838,968 B2
(45) Date of Patent: Nov. 23, 2010

(54) SEMICONDUCTOR DEVICE AND METHOD OF FABRICATING SAME

(75) Inventors: Hongyong Zhang, Atsugi (JP); Satoshi Teramoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 106 days.

(21) Appl. No.: 11/293,111

(22) Filed: Dec. 5, 2005

(65) Prior Publication Data

US 2006/0151835 A1 Jul. 13, 2006

Related U.S. Application Data

(62) Division of application No. 08/835,729, filed on Apr. 11, 1997, now Pat. No. 7,019,385.

(30) Foreign Application Priority Data

Apr. 12, 1996 (JP) .................................. 8-115672

(51) Int. Cl.
*H01L 23/58* (2006.01)
*H01L 27/01* (2006.01)
*H01L 29/04* (2006.01)

(52) U.S. Cl. .................... 257/640; 257/59; 257/72; 257/347; 257/637; 257/649

(58) Field of Classification Search ............ 257/59, 257/67–70, 72, 637, 347–354, 640, 641, 257/649

See application file for complete search history.

(56) References Cited

U.S. PATENT DOCUMENTS

| 4,468,855 A | 9/1984 | Sasaki |
| 4,625,224 A | 11/1986 | Nakagawa et al. |
| 4,656,101 A | 4/1987 | Yamazaki |
| 4,746,628 A | 5/1988 | Takafuji et al. |
| 4,782,037 A | 11/1988 | Tomozawa et al. |
| 4,851,363 A | 7/1989 | Troxell et al. |
| 5,040,037 A | 8/1991 | Yamaguchi et al. |
| 5,041,888 A | 8/1991 | Possin et al. |
| 5,130,772 A | 7/1992 | Choi |
| 5,270,567 A | 12/1993 | Mori et al. |

(Continued)

FOREIGN PATENT DOCUMENTS

JP 56-111258 9/1981

(Continued)

OTHER PUBLICATIONS

T. Ohori et al.; "27.1 Low-Temperature Poly-Si SXGA TFT-LCDs with Monolithic Drivers"; *SID 96 Digest*; pp. 673-676; 1996.

*Primary Examiner*—Ori Nadav
(74) *Attorney, Agent, or Firm*—Fish & Richardson P.C.

(57) ABSTRACT

There are disclosed TFTs having improved reliability. An interlayer dielectric film forming the TFTs is made of a silicon nitride film. Other interlayer dielectric films are also made of silicon nitride. The stresses inside the silicon nitride films forming these interlayer dielectric films are set between $-5 \times 10^9$ and $5 \times 10^9$ dyn/cm$^2$. This can suppress peeling of the interlayer dielectric films and difficulties in forming contact holes. Furthermore, release of hydrogen from the active layer can be suppressed. In this way, highly reliable TFTs can be obtained.

11 Claims, 9 Drawing Sheets

U.S. PATENT DOCUMENTS

| | | | |
|---|---|---|---|
| 5,306,651 | A | 4/1994 | Masumo et al. |
| 5,313,075 | A | 5/1994 | Zhang et al. |
| 5,434,433 | A | 7/1995 | Takasu et al. |
| 5,650,636 | A | 7/1997 | Takemura et al. |
| 5,719,065 | A | 2/1998 | Takemura et al. |
| 5,771,321 | A | 6/1998 | Stern |
| 5,815,223 | A | 9/1998 | Watanabe et al. |
| 5,926,699 | A | 7/1999 | Hayashi et al. |
| 5,940,732 | A | 8/1999 | Zhang |
| 5,945,711 | A | 8/1999 | Takemura et al. |
| 6,023,074 | A | 2/2000 | Zhang |
| 6,198,133 | B1 | 3/2001 | Yamazaki et al. |
| 6,259,117 | B1 | 7/2001 | Takemura et al. |
| 6,297,518 | B1 | 10/2001 | Zhang |
| 6,335,555 | B1 | 1/2002 | Takemura et al. |
| 6,495,858 | B1 | 12/2002 | Zhang |
| 2003/0042559 | A1 | 3/2003 | Takemura et al. |
| 2003/0047733 | A1 | 3/2003 | Takemura et al. |

FOREIGN PATENT DOCUMENTS

| | | |
|---|---|---|
| JP | 58-093273 | 6/1983 |
| JP | 58-164268 | 9/1983 |
| JP | 58-204570 | 11/1983 |
| JP | 59-089436 | 5/1984 |
| JP | 59-126673 | 7/1984 |
| JP | 61-026264 | 2/1986 |
| JP | 63-132433 | 6/1988 |
| JP | 63-204769 | 8/1988 |
| JP | 63-237570 | 10/1988 |
| JP | 01-023575 | 1/1989 |
| JP | 01-032678 | 2/1989 |
| JP | 01-035961 | 2/1989 |
| JP | 01-047076 | 2/1989 |
| JP | 01-096960 | 4/1989 |
| JP | 01-276672 | 11/1989 |
| JP | 03-023639 | 1/1991 |
| JP | 03-034434 | 2/1991 |
| JP | 03-036769 | 2/1991 |
| JP | 04-330783 | 11/1992 |
| JP | 04-340724 | 11/1992 |
| JP | 05-55581 | 3/1993 |
| JP | 05-55582 | 3/1993 |
| JP | 05-125547 | 5/1993 |
| JP | 05-129286 | 5/1993 |
| JP | 05-167075 | 7/1993 |
| JP | 07-007156 | 1/1995 |
| JP | 07-153971 | 6/1995 |
| KR | 288039 | 5/2001 |
| KR | 297063 | 10/2001 |

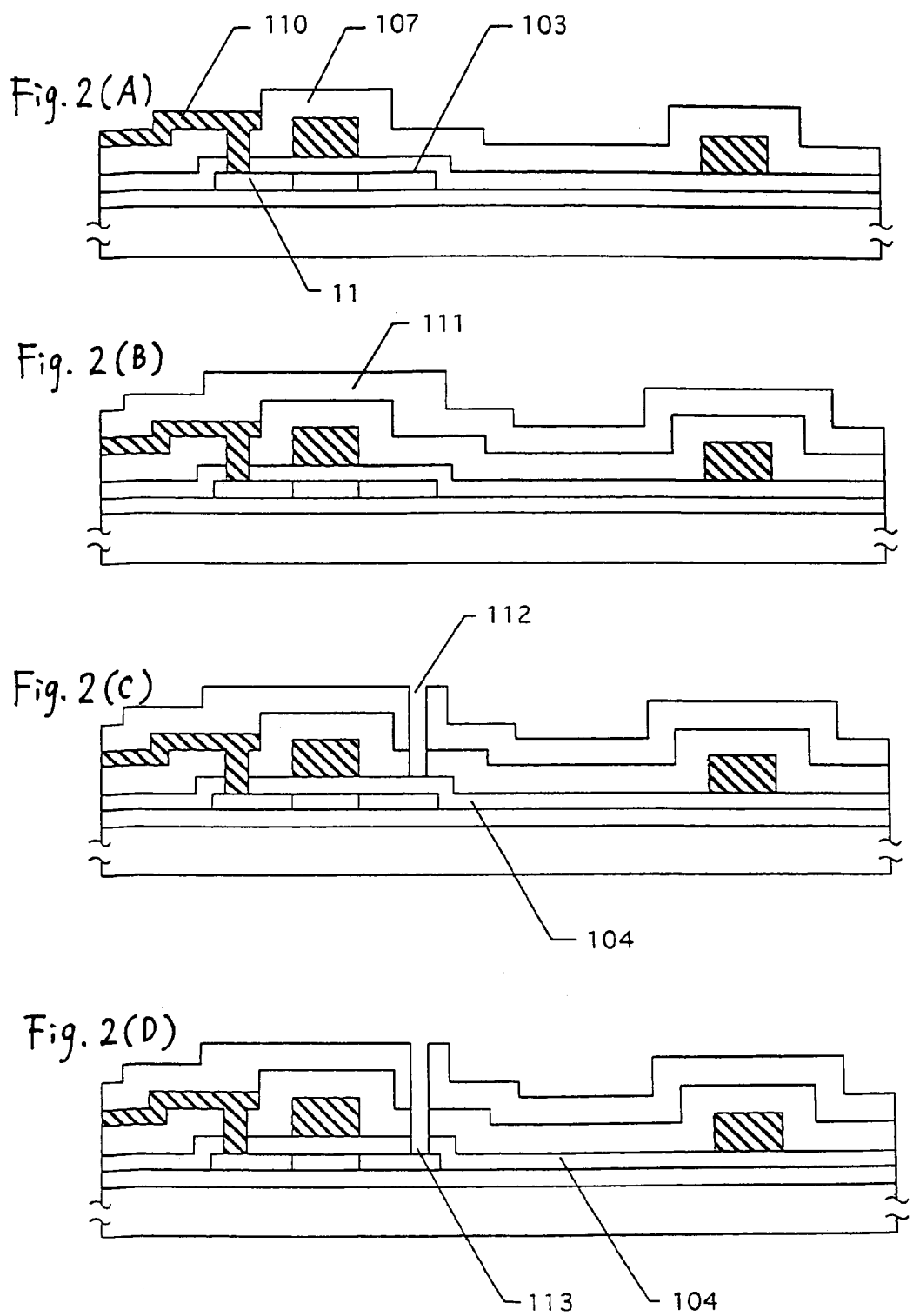

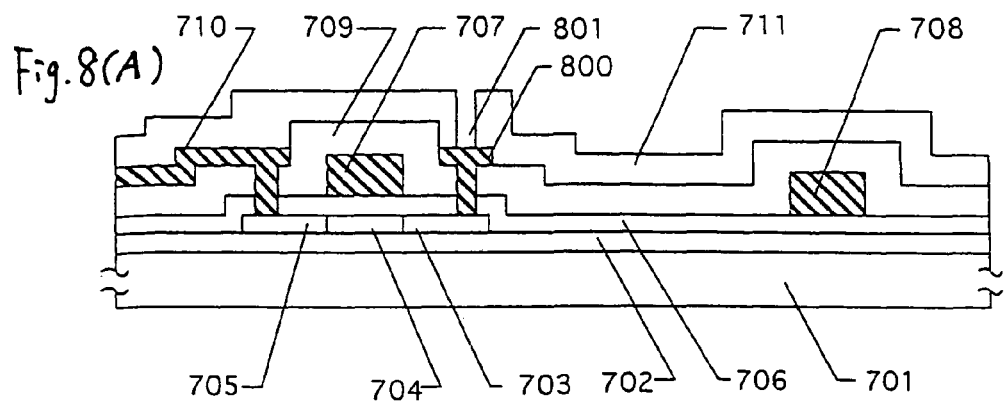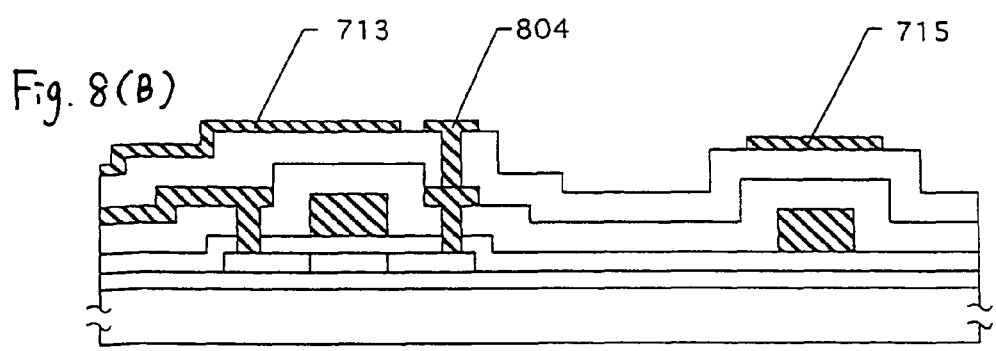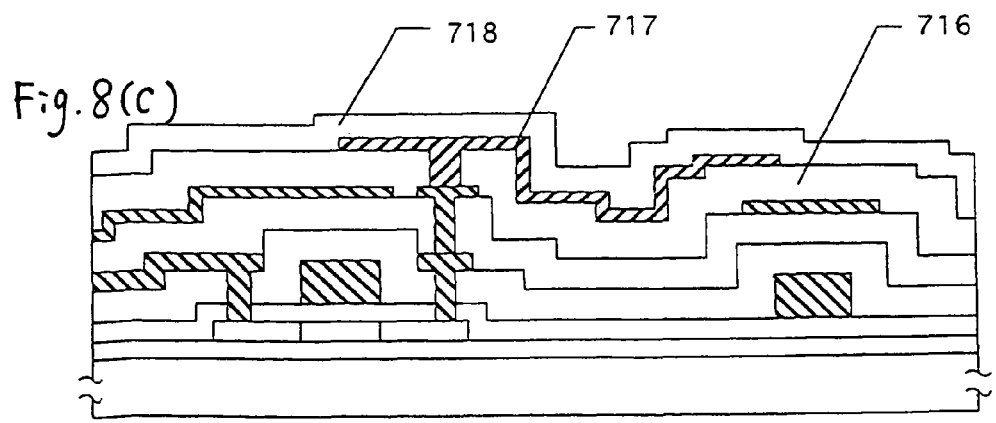

SEMICONDUCTOR DEVICE AND METHOD OF FABRICATING SAME

BACKGROUND OF THE INVENTION

1. Field of the Invention

The present invention relates to a thin-film transistor construction and to a method of fabricating it.

2. Description of the Related Art

Thin-film transistors (TFTs) fabricated on a glass substrate or on an insulating surface have been known. TFTs of this type have been developed especially for use in active matrix liquid crystal displays.

In an active matrix liquid crystal display, millions of pixel electrodes are arranged in rows and columns, and TFTs are connected with these pixel electrodes. Electric charges going into and out of the pixel electrodes are controlled by their respective TFTs.

Manufacture of this type of active matrix liquid crystal display needs a technique for fabricating tens of thousands of TFTs on a glass substrate or quartz substrate that is at least several centimeters square.

With today's technique, it is impossible to produce a single-crystal silicon thin film on a glass or quartz substrate that is at least several centimeters square. Accordingly, generally manufactured silicon films are typified by films of amorphous silicon, polycrystalline silicon, and crystallite silicon.

Where an amorphous silicon film is used, the P-channel type cannot be made practical. Also, high-speed operation cannot be accomplished. Therefore, it is impossible to produce from TFTs using an amorphous silicon film a peripheral driver circuit that is required to operate at or above several megahertz.

On the other hand, where a crystalline silicon film typified by polycrystalline and crystallite silicon films is employed, the P-channel TFT can be put into practical use. Consequently, CMOS circuits can be built. In addition, high-speed operations at or above several megahertz are possible. Utilizing these features, a peripheral driver circuit can be integrated with an active matrix circuit on the same substrate.

Yet, TFTs using a crystalline silicon film suffer from reliability problem and characteristic variations. These give rise to a deterioration of the quality of the displayed image.

These reliability and characteristic variation problems are caused by unstable factors contained in the processing step for creating contact holes, as well as unstable factors contained in the state of the crystalline silicon film forming the active layer.

It is generally known that a silicon oxide film is used as an interlayer dielectric film in TFTs. However, the silicon oxide film poses problems as described below.

The silicon oxide film shows a low etch rate during a dry etching process. In order to obtain a practical etch rate, it is necessary to increase the self-bias voltage to about 600 V. This often results in electrostatic discharge damage due to a voltage induced across multilayer metallization when conductive interconnects are formed.

Furthermore, since the etching process is carried out, using an increased self-bias voltage, the etching process tends to be unstable. Hence, it is difficult to secure a sufficient process margin.

For example, it is difficult to taper the end portions of contact holes by devising the etching conditions.

Generally, where the active layer of TFTs is formed, using a crystalline silicon film, it is necessary to terminate the active layer with hydrogen. That is, the dangling bonds of silicon within the crystalline silicon film are neutralized with hydrogen, thus stabilizing the electrical properties.

It is necessary to form an interlayer dielectric film after the formation of the active layer, irrespective of the type of TFTs.

Where a silicon oxide film is used as the interlayer dielectric film, there arises the problem that hydrogen contained in the active layer is easily freed, because there exists only a weak barrier to hydrogen within the silicon oxide film. This immensely contributes to instability of the TFT characteristics.

Where a silicon oxide film is used as the interlayer dielectric film, it is difficult to detect the endpoint of the etching where the etching is a dry etching process. Generally, quartz jigs are used with a holder or stage that holds a substrate.

In this case, during the dry etching process, silicon oxide constituents are released into the etching ambient from the quartz jigs. This makes it difficult to detect the endpoint of the etching of the silicon oxide film.

In particular, the detection of the silicon oxide component within the ambient renders it difficult to detect the endpoint of the etching of the silicon oxide film clearly.

This means that the number of unstable factors in the manufacturing process increases.

SUMMARY OF THE INVENTION

It is an object of the present invention to provide TFTs that show stable characteristics and can be fabricated at a high yield by eliminating the difficulties with the fabrication of the TFTs.

It is another object of the invention to provide an active matrix display device that shows high image quality stably and can be fabricated at a high yield.

A semiconductor device disclosed herein comprises an active layer consisting of a semiconductor, a silicon oxide film formed on the active layer, and a multilayer silicon nitride film formed on the first dielectric film. The silicon oxide film acts as a gate insulator film. The silicon nitride film acts as an interlayer dielectric film.

The present invention also provides a semiconductor device consisting of TFTs comprising an active layer consisting of a crystalline silicon film and interlayer dielectric films all of which are made of silicon nitride.

Where the silicon nitride film is used as the interlayer dielectric films, the following advantages can be obtained.

First, the dry etch rate is high. Also, the self-bias voltage can be set to a low value of approximately 1500 V. Consequently, etching can be effected stably. Furthermore, a large process margin can be obtained.

Besides, there exists a high barrier against hydrogen and so release of hydrogen contained in the active layer can be prevented. In consequence, the characteristics of the TFTs age to a lesser extent than heretofore.

In addition, the relative dielectric constant is high. Therefore, capacitors can be easily formed, using the interlayer dielectric films. Especially, in an active matrix liquid crystal display, it is necessary to connect auxiliary capacitors to the outputs of TFTs disposed at the pixels. It is advantageous to form these auxiliary capacitors from a silicon nitride film that forms the interlayer dielectric films.

Preferably, the quality of the silicon nitride film constituting the interlayer dielectric films in the present invention disclosed herein is so set that the internal stress lies in the range of $-5 \times 10^9$ to $5 \times 10^9$ dyn/cm$^2$.

This is important in preventing peeling of the film when a multilayer structure is formed. Also, this is important in preventing peeling of electrodes and conductive interconnects formed on the interlayer dielectric films. Furthermore, this is important in preventing stress-induced breaks in contact electrodes and poor contacts.

Especially, where ITO electrodes creating pixel electrodes are formed on the interlayer dielectric films, the above-described requirement is important in preventing peeling of the ITO electrodes.

These restrictions on stress become more important as the area of the active matrix region increases. As the area of the viewing screen is increased, the area of the active matrix region increases.

It is advantageous to design the silicon nitride films forming the interlayer dielectric films so that the internal stresses lie in the range $-5 \times 10^9$ to $5 \times 10^9$ dyn/cm$^2$ and that every silicon nitride film is compressively stressed. This makes the direction of acting stress uniform for every interlayer dielectric film, which in turn is effective in preventing peeling of the films. Also, breaks in the conductive interconnects and contact electrodes and poor contacts can be effectively prevented.

Similarly, where every interlayer dielectric film is tensilely stressed, advantages arise.

Moreover, it is advantageous to suppress the variations of internal stress among the various layers of silicon nitride forming the interlayer dielectric films to less than ±50%.

Additionally, it is advantageous to use such a silicon nitride film forming an interlayer dielectric film that its etch rate with respect to 1/10 buffered hydrofluoric acid lies in the range of 30 to 1500 Å/min.

The present invention also provides a method of fabricating a semiconductor device utilizing a silicon nitride film, the method involving a step of forming the silicon nitride film by chemical vapor deposition. This method is characterized in that the internal stress of the silicon nitride film grown by introducing hydrogen into the film growth ambient lies in the range of $-5 \times 10^9$ to $5 \times 10^9$ dyn/cm$^2$ and that its etch rate with respect to 1/10 buffered hydrofluoric acid lies in the range of 30 to 1500 Å/min.

BRIEF DESCRIPTION OF THE DRAWINGS

FIGS. 2(A)-2(D) are views illustrating processing steps for fabricating TFTs;

FIGS. 8(A)-8(C) are views illustrating processing steps for fabricating TFTs.

DETAILED DESCRIPTION OF THE PREFERRED EMBODIMENTS

Embodiment 1

The present invention relates to processing steps for fabricating thin-film transistors (TFTs) arranged at pixels of an active matrix liquid crystal display.

Figure 1A:
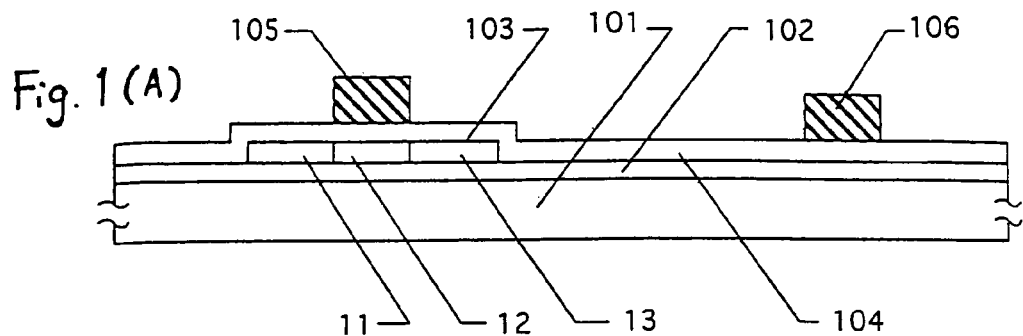
FIGS. 1(A)-1(D) are views illustrating processing steps for fabricating TFTs.

The processing steps of the present embodiment for fabricating TFTs are shown in FIGS. 1(A)-3(B). First, as shown in FIG. 1(A), a silicon oxide film is formed as a buffer film 102 on a glass substrate 101 to a thickness of 3000 Å by plasma CVD (chemical vapor deposition) or sputtering. The buffer film also may be made of silicon oxide.

The substrate is not limited to the glass substrate 101. A quartz substrate or other substrate (e.g., semiconductor substrate) on which an appropriate dielectric film is deposited also may be used. In an integrated circuit having multilevel metallization or multilayer structure, an appropriate insulating film can be used as the substrate.

Then, a silicon film (not shown) that will later form an active layer of TFTs is deposited. In this embodiment, an amorphous silicon film 500 Å thick is formed by plasma CVD. The amorphous silicon film also may be built up by LPCVD.

Thereafter, heat treatment and laser irradiation are carried out to crystallize the amorphous silicon film, thus obtaining a crystalline silicon film (not shown).

After obtaining the crystalline silicon film, it is patterned to form the active layer 103 of the TFTs. A silicon oxide film 104 acting as a gate insulator film is deposited to a thickness of 1000 Å by plasma CVD.

A silicide material or metal material for forming gate electrodes is deposited as a film. This film is then patterned to create gate electrodes 105 and scanning lines (also known as gate lines) 106. Although not clearly shown, it is common practice to make the gate electrodes 105 extend from the scanning lines 106.

Silicon materials that are heavily doped and thus have decreased resistivities can be used as the material of the gate electrodes 105 and scanning lines 106. Also, various silicide materials and metal materials typified by aluminum and molybdenum can be employed.

In this way, a state shown in FIG. 1(A) is obtained. Under this condition, dopant ions are implanted to create source and drain regions. In this embodiment, phosphorus (P) ions are implanted by plasma doping to fabricate N-channel TFTs.

After the dopant implantation, irradiation of laser light or other intense light is effected to anneal and activate the dopant-implanted regions. This processing step may utilize a method relying on heating.

In this way, source regions 11, drain regions 13, and channel formation regions 12 are formed in a self-aligned manner.

Figure 1B:
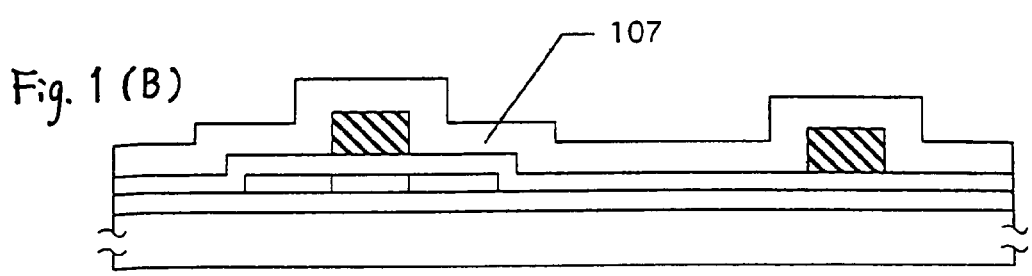

Then, as shown in FIG. 1(B), a silicon nitride film is deposited as a first interlayer dielectric film 107 to a thickness of 3000 Å by plasma CVD. The thickness of this silicon nitride film can be set between approximately 3000 and 5000 Å. One example of conditions under which the silicon nitride film is grown is given in Table 1 below.

TABLE I

|  | Item | Without hydrogen | With hydrogen |
|---|---|---|---|
| Film growth conditions | SiH$_4$ (sccm) | 10 | 10 |
|  | NH$_3$ (sccm) | 75 | 50 |
|  | N$_2$ (sccm) | 500 | 50 |
|  | H$_2$ (sccm) | 0 | 150 |
|  | Growth pressure (Torr) | 0.7 | 0.7 |
|  | RF power (W) | 300 | 300 |
|  | Set temperature (° C.) | 300 | 300 |
| Film Characteristics | Growth rate (Å/min) | 293 | 216 |
|  | In-plane uniformity (%) | ±2.1 | ±2.1 |
|  | Index of refraction | 1.852 | 1.907 |
|  | Etch rate (Å/min) | 348 | 121 |

TABLE I-continued

| Item | Without hydrogen | With hydrogen |
|---|---|---|
| Dielectric breakdown field strength (MV/cm) (J = 1.0 μA/cm$^2$) | $5.8 \times 10^6$ | $5.0 \times 10^6$ |
| Leakage current density (A/cm$^2$) (E = 1.0 MV/cm) | $5.6 \times 10^{-10}$ | $3.7 \times 10^{-10}$ |
| Internal stress (dyn/cm$^2$) | $7.0 \times 10^9$ | $4.0 \times 10^9$ |

The etch rate given in Table 1 is the value obtained when a wet etchant LAL500 produced by Hashimoto Kasei Corporation was used. The internal stress of a film can be found by varying the hydrogen content.

Table 1 shows the film growth conditions under which no hydrogen was added to the ambient, for comparison. The internal stress and etch rate lead us to consider that a silicon nitride film grown in an ambient to which no hydrogen is added cannot be said to be a silicon nitride film.

The active layer 103 is hydrogen-terminated when this silicon nitride film is grown. That is, hydrogen mixed into the ambient and the hydrogen produced by decomposition of ammonia are activated by the plasma energy and encroach into the crystalline silicon film forming the active layer 103. This anneals the crystalline silicon film forming the active layer, so that the film is hydrogen-terminated.

As mentioned previously, a silicon nitride film presents a barrier to hydrogen. Accordingly, it can be said that the formation of the first interlayer dielectric film 107 acts to confine hydrogen within the active layer 103.

Figure 1C:
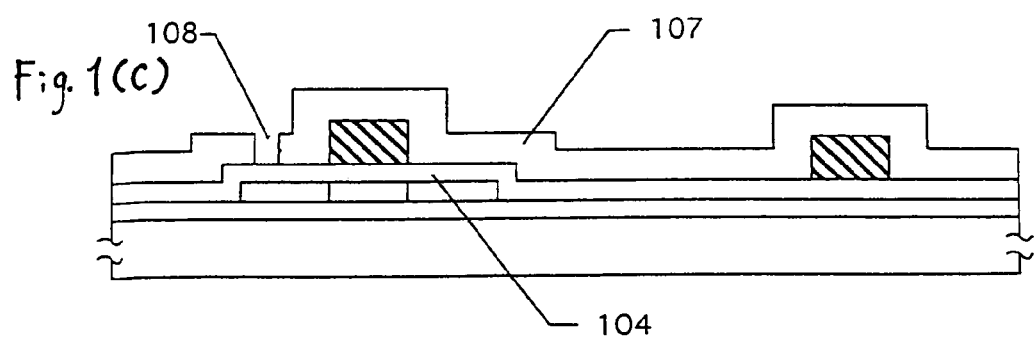

Then, contact holes 108 are created in the first interlayer dielectric film 107 by a dry etching method (FIG. 1(C)).

The dry etching method used in this processing step is an RIE (reactive ion etching) method using mixture gas of CF$_4$ and O$_2$ as an etchant gas.

In this step, overetch can be prevented by using the silicon oxide film 104 as an etch stopper.

Then, contact holes 109 extending from the silicon oxide film 104 are created by a wet etching method. In other words, the bottom portions of the contact holes 108 where the silicon oxide film 104 is exposed are etched, followed by the formation of the contact holes 109.

In this embodiment, the wet etching is effected, using an etchant that is a mixture of hydrofluoric acid, ammonia fluoride, and a surface active agent.

This removal of the silicon oxide film 104 for creating the contact holes 109 can be carried out without using any mask. In particular, the resist mask used for the formation of the contact holes 108 can be used intact.

Alternatively, if any resist mask is not present, the contact holes 109 can be formed in a self-aligned manner by making use of the contact holes 108 previously formed.

Generally, the etch rate of the silicon nitride film with respect to HF-based etchants is lower than that of the silicon oxide film by a factor of about 10 or more. Therefore, etching of the silicon oxide film presents little problem during the above-described step.

In this embodiment, wet etching is used in forming the contact holes 109. A method relying on dry etching also may be exploited. In this case, the contact holes 109 may be formed subsequently to the formation of the contact holes 108. However, the etchant gas must be replaced by CHF$_3$ in the dry etching step (FIG. 1(D)).

Figure 1D:
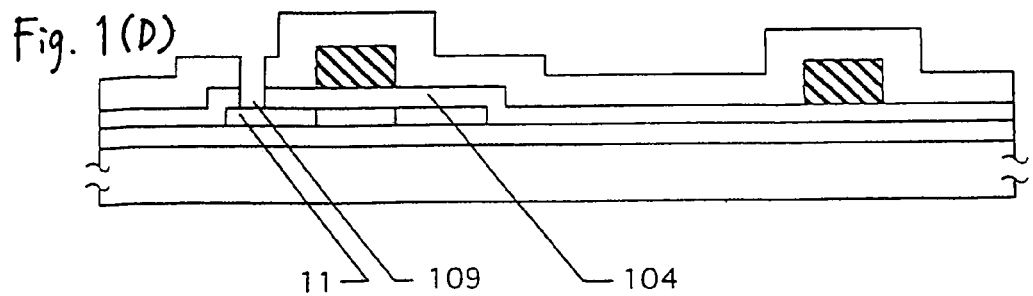

After obtaining the state shown in FIG. 1(D), source interconnects 110 making contact with source electrodes or source regions are fabricated from an appropriate metal material (FIG. 2(A)).

Then, a silicon nitride film is formed as a second interlayer dielectric film 111 to a thickness of 3000 Å by plasma CVD. The thickness of the silicon nitride film forming the second interlayer dielectric film 111 may be set between 2000 and 5000 Å (FIG. 2(B)).

This second interlayer dielectric film 111 is grown under the same conditions as the first interlayer dielectric film 107. Where the film thickness is varied, only the conditions associated with the film thickness are modified.

Subsequently, contact holes 112 are created in the silicon nitride films that form the first interlayer dielectric film 107 and the second layer dielectric film 111, respectively (FIG. 2(C)).

This dry etching is carried out under the same conditions as the formation of the contact holes 108 shown in FIG. 1(C). However, since the etch depth is different, it is necessary to perform a preliminary experiment to determine the etching time.

Also during this step, the silicon oxide film 104 can be used as an etch stopper.

In this manner, a state shown in FIG. 2(C) results. Then, the silicon oxide film 104 exposed at the bottoms of the contact holes 112 is etched by a wet etching method. In consequence, contact holes 113 are created. These contact holes 113 also may be formed by dry etching.

Figure 3A:
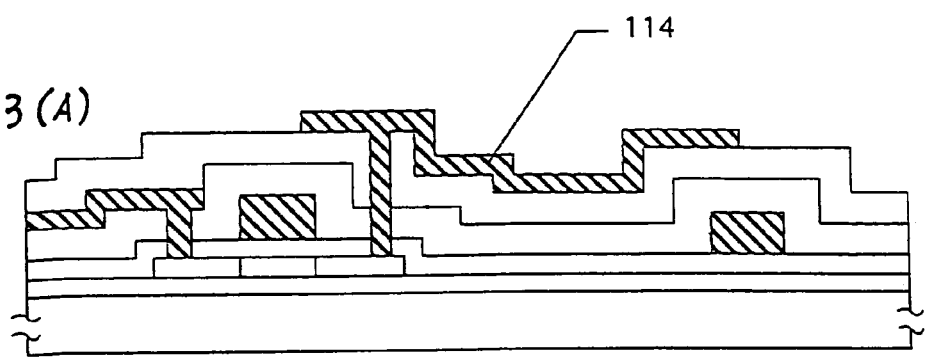
FIGS. 3(A) and 3(B) are views illustrating processing steps for fabricating TFTs.

After obtaining the state shown in FIG. 2(D), an ITO film for forming pixel electrode is formed by a sputtering method, and is patterned to form the pixel electrodes 114 (FIG. 3(A)).

Figure 3B:
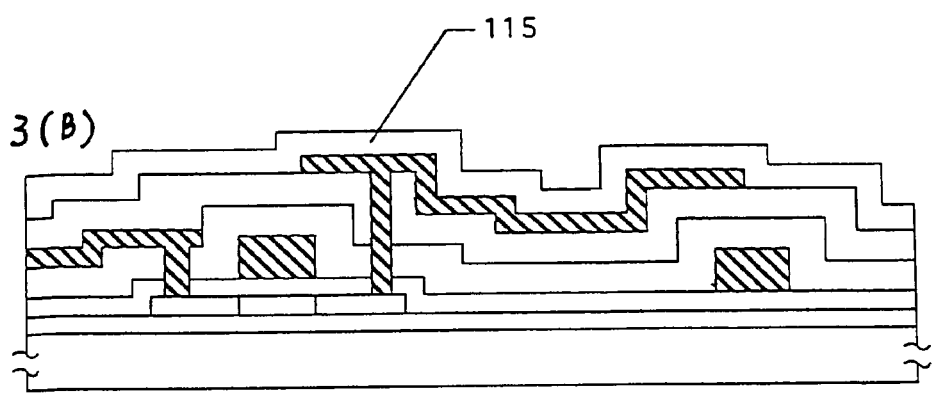

A final protective film 115 is formed also from a silicon nitride film (FIG. 3(B)).

An orientation film (not shown) for orienting the liquid crystal material is formed on the protective film 115 and oriented.

In this way, TFTs disposed at pixel portions of an active matrix liquid crystal display are completed.

In these TFTs, a silicon nitride film is used as an interlayer dielectric film and so contact holes can be created with high reproducibility, using a dry etching process.

Since the silicon nitride film used as the interlayer dielectric film serves to confine hydrogen existing within the active layer, instability and aging of the characteristics of the TFTs can be suppressed.

Embodiment 2

The present embodiment is similar to the configuration described in Embodiment 1 except that LDD (lightly doped drain) regions are arranged in the TFTs. A process sequence for the present embodiment is shown in FIGS. 4(A)-4(D), 5(A)-5(D), and, 6(A)-6(B). The present embodiment has the same process conditions and details as used in Embodiment 1.

First, a silicon oxide film 402 is formed as a buffer film on a glass substrate 401 to a thickness of 3000 Å. Then, an amorphous silicon film (not shown) is grown by plasma CVD. The amorphous silicon film is crystallized by a combination of thermal processing and laser light irradiation to obtain a crystalline silicon film (not shown).

The above-described crystalline silicon film is patterned to form islands of regions 403 (FIG. 4(A)) that will become the active layer of TFTs later.

After building up the active layer 403, a silicon oxide film 404 acting as a gate insulator film is formed to a thickness of 1000 Å by plasma CVD.

An aluminum film (not shown) for forming gate electrodes is formed to a thickness of 4000 Å by sputtering.

This aluminum film contains 0.1% by weight of scandium to prevent generation of hillocks and whiskers in later processing steps. These hillocks and whiskers are needle-like elevated portions and spikes formed by abnormal growth of aluminum in a heating step.

After growing the aluminum film (not shown), it is patterned to form gate electrodes 405. At the same time, scanning lines 406 are formed.

Then, anodization is carried out to form a porous anodic oxide film, 407 and 408. This porous anodic oxide film, 407 and 408, is formed by performing anodization within an electrolytic solution, using a cathode of platinum and anodes consisting of aluminum film pattern portions 405 and 406. In this embodiment, an aqueous solution containing 3% oxalic acid is used as the electrolytic solution.

During this anodization process, the porous anodic oxide film can be grown up to several micrometers by controlling the anodization time. In this embodiment, this porous anodic oxide film is grown to a thickness of 5000 Å.

Then, anodization is again performed, using an ethylene glycol solution containing a 3% tartaric acid as an electrolytic solution. As a result of this processing step, an anodic oxide film, 409 and 410, is formed. This anodic oxide film is of the barrier type and dense in nature.

The growth distance of this dense anodic oxide film, 409 and 410, can be controlled by the applied voltage. In this embodiment, the film thickness is set to 700 Å. This anodic oxide film can be grown up to about 3000 Å.

Where the thickness of this dense anodic oxide film is increased, the increased thickness permits formation of offset gate regions. Where effective offset gate regions are formed, it is necessary to set the thickness of the anodic oxide film to more than 2000 Å.

Figure 4A:
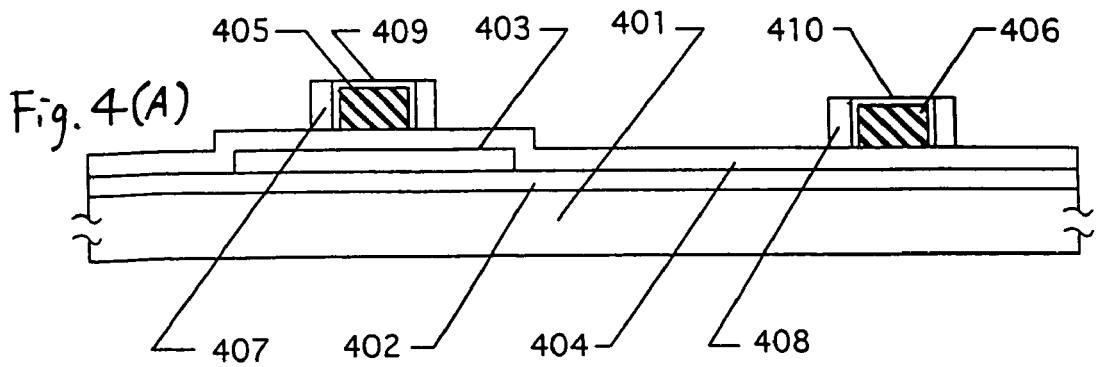
FIGS. 4(A)-4(D) are views illustrating processing steps for fabricating TFTs.

Since the electrolytic solution enters the porous dense anodic oxide film, 409 and 410, this film is created in the state shown in FIG. 4(A).

After obtaining the state shown in FIG. 4(A), the exposed silicon oxide film 404 is removed. The porous anodic oxide film, 407 and 408, is removed selectively, using a mixed acid of acetic, nitric, and phosphoric acids.

Then, dopant ions are implanted. In this embodiment, P-type ions are introduced to form each N-channel TFT. In this processing step, a source region 41, a channel formation region 42, a lightly doped (LDD) region 43, and a drain region 44 are formed in a self-aligned manner (FIG. 4(B)).

After the implantation of the above-described dopant ions, irradiation of laser light or other intense light is done to anneal and activate the dopant-implanted regions.

A first interlayer dielectric film 412 is formed. A silicon nitride film 412 is formed as the first interlayer dielectric film 412 having a thickness of 3000 Å by plasma CVD. The hydrogen content of the ambient in which the silicon nitride film is grown is so controlled that the stress in the film lies within the range of $-5 \times 10^9$ to $5 \times 10^9$ dyn/cm$^2$.

During this processing step, the active layer 403 is simultaneously hydrogen-passivated.

Figure 4B:
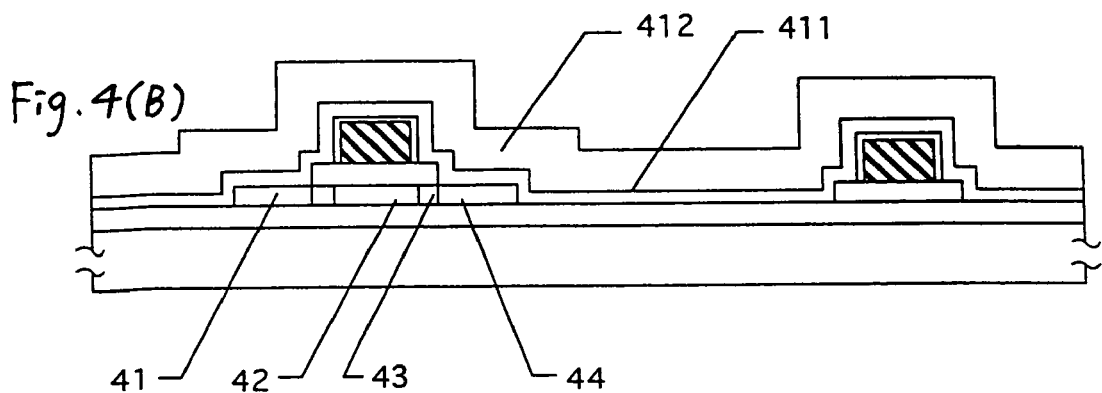

In this way, a state shown in FIG. 4(B) is obtained. Then, contact holes 413 are created by a dry etching method (FIG. 4(C)).

Figure 4C:
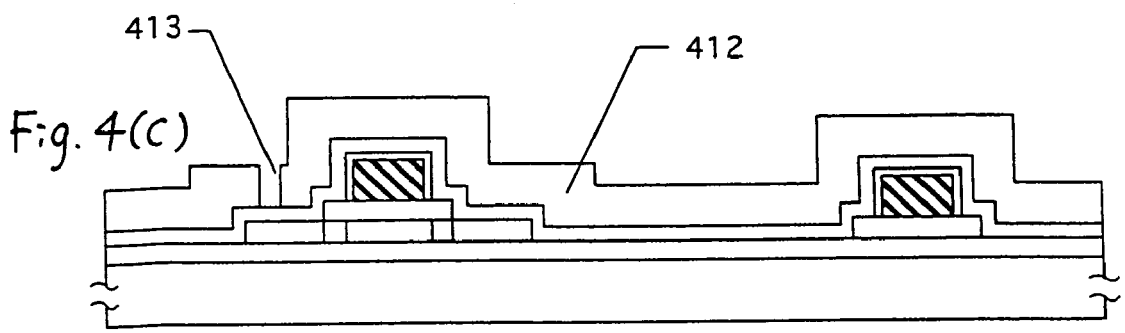

In this manner, a state shown in FIG. 4(C) is obtained. Contact holes 414 are formed in the silicon oxide film 411 by wet etching. The contact holes also may be created by dry etching.

Figure 4D:
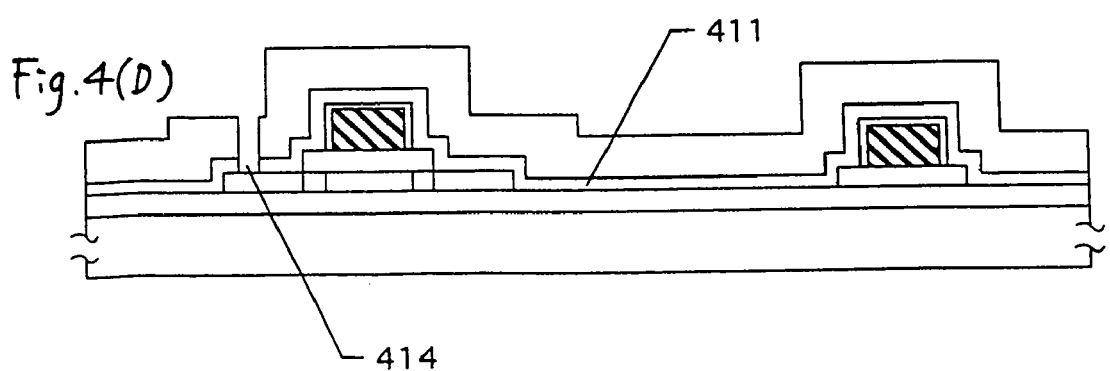
Figure 5A:
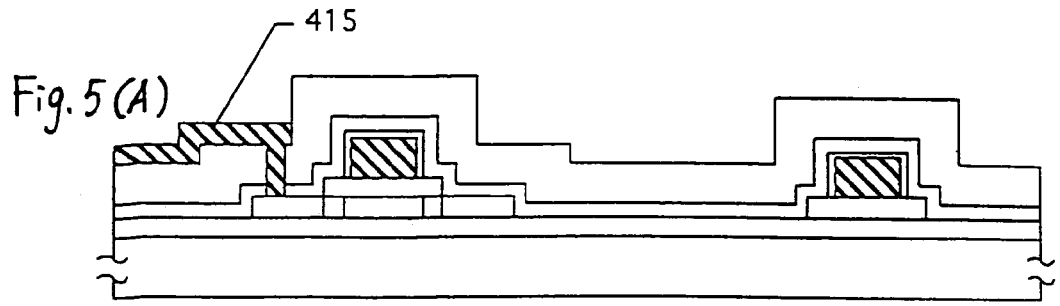
FIGS. 5(A)-5(D) are views illustrating processing steps for fabricating TFTs.
Figure 5B:
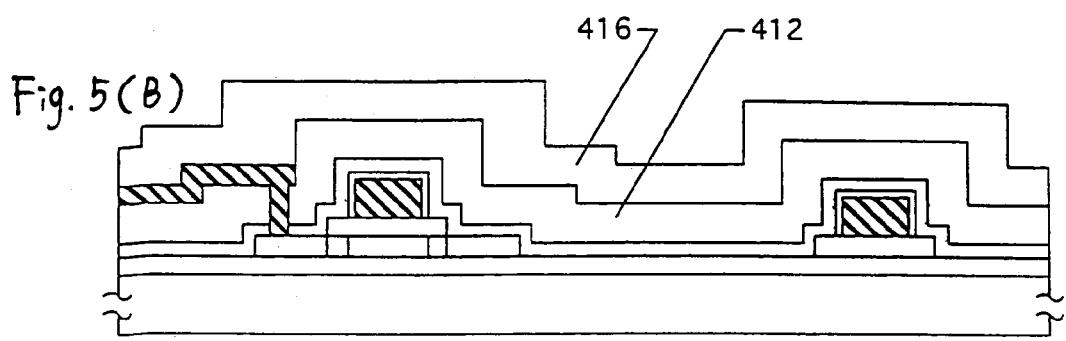
Figure 5C:
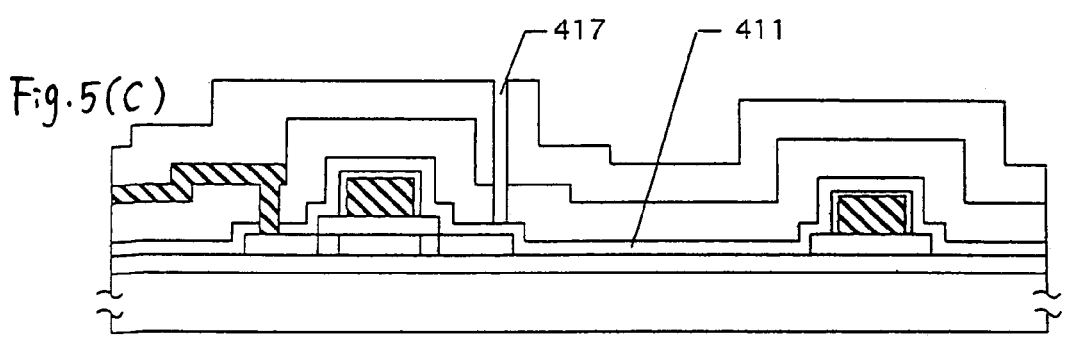

Thus, a state shown in FIG. 4(D) is derived. Then, source interconnects 415 in contact with source electrodes 415 or source regions are formed, as shown in FIG. 5(A). In the present embodiment, these electrodes or interconnects are made from a titanium/aluminum/titanium lamination film (FIG. 5(A)).

Then, a silicon nitride film 3000 Å thick is formed as a second interlayer dielectric film 416 by plasma CVD. This silicon nitride film is grown under the same conditions as the first interlayer dielectric film 412 (FIG. 5(B)).

Contact holes 417 extending through, the silicon nitride films 412 and 416 are formed by a dry etching method: (FIG. 5(C)).

Then, wet etching is carried out to form contact holes 418 reaching the drain region 44. The contact holes 418 also may be created by a dry etching method.

Figure 5D:
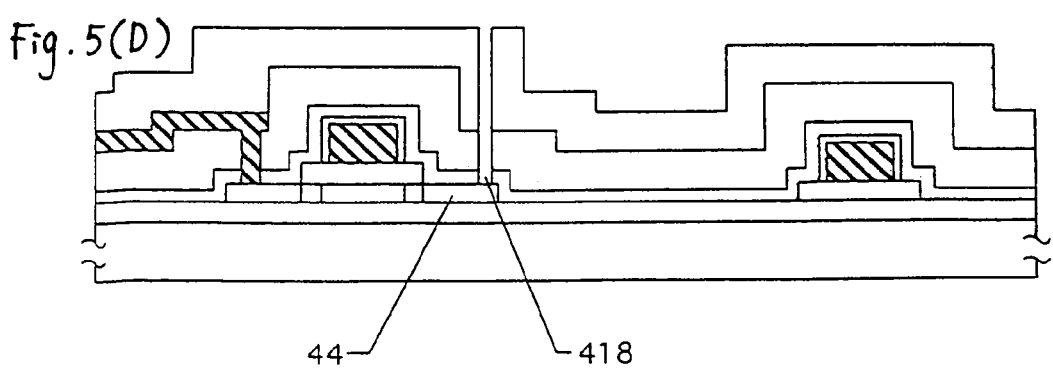

In this way, the contact holes extending through the first and second interlayer dielectric films 412 and 416 to the drain regions 44 can be formed (FIG. 5(D)).

Figure 6A:
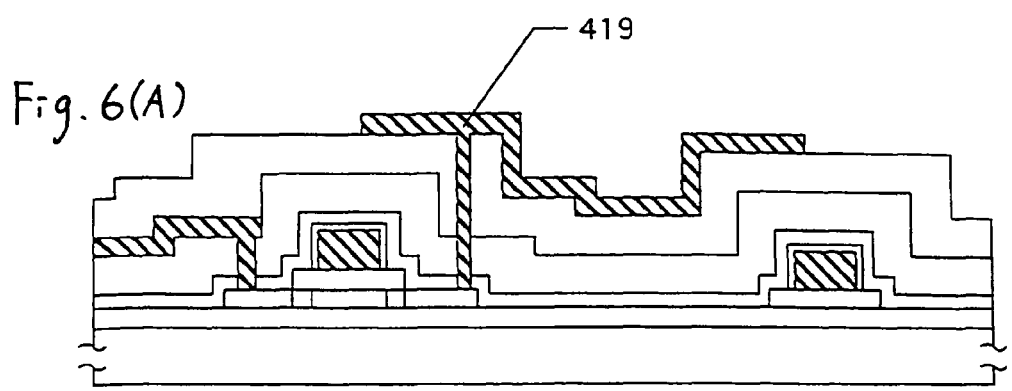
FIGS. 6(A)-6(B) are views illustrating processing steps for fabricating TFTs.

Thereafter, an ITO film for forming pixel electrodes is formed and patterned to create pixel electrodes 419 as shown in FIG. 6(A).

Figure 6B:
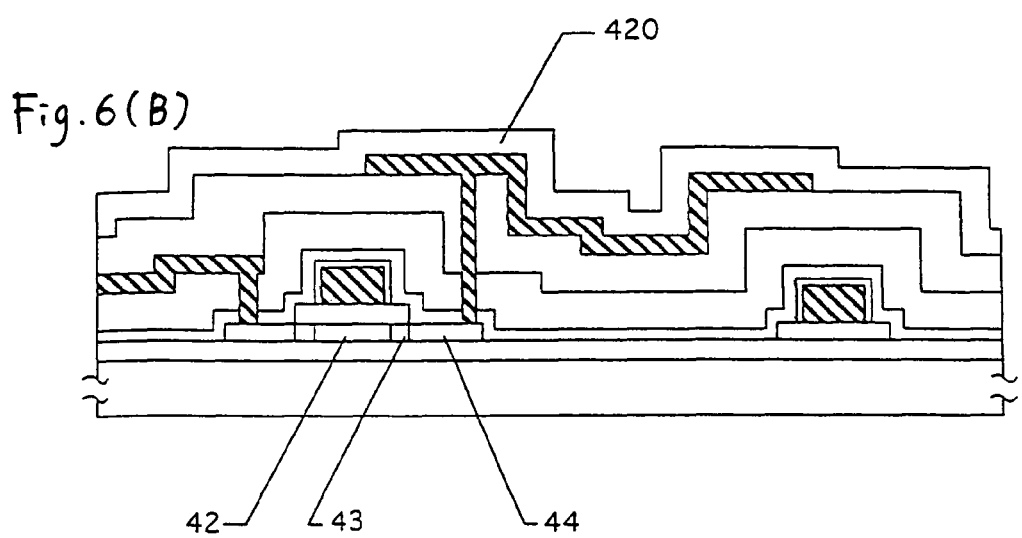

A silicon oxide film 420 is formed as a final protective film, thus obtaining a state shown in FIG. 6(B).

In the TFTs described in the present embodiment, the lightly doped (LDD) region 43 is arranged between the channel formation region 42 and the drain region 44 to moderate the field strength between these two regions. This region is normally referred to as an LDD region and is effective in lowering the OFF current.

The TFTs described in the present embodiment can have excellent ability to hold electric charges stored in the pixel electrodes 419. This capability is useful in displaying an image of higher quality.

Embodiment 3

Figure 7A:
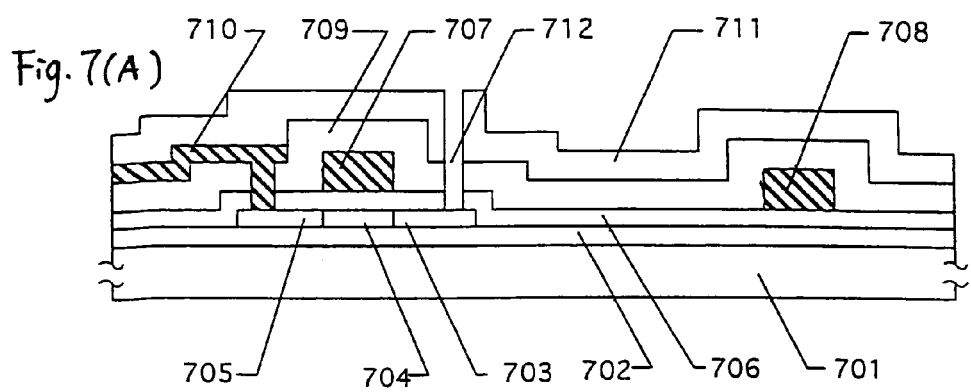
FIGS. 7(A)-7(C) are views illustrating processing steps for fabricating TFTs.
Figure 7B:
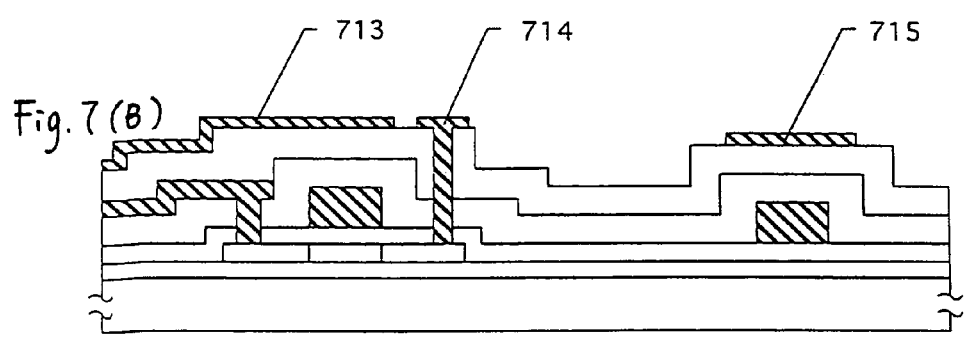
Figure 7C:
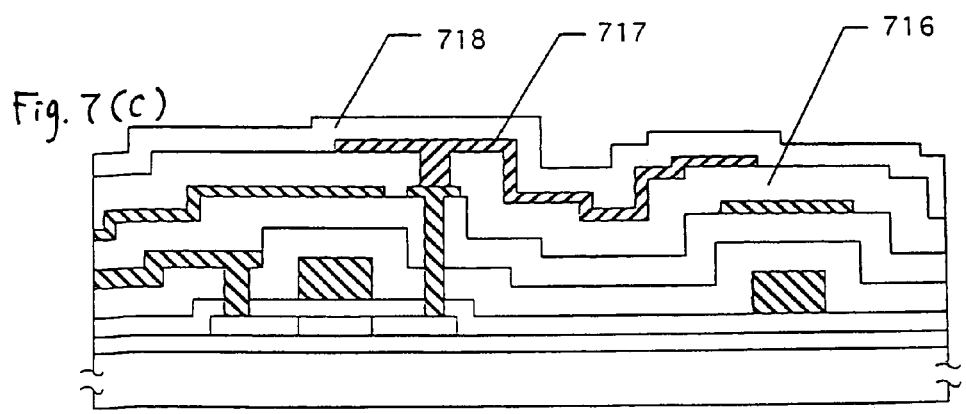

The present embodiment relates to a structure in which a black matrix is disposed on a TFT panel substrate. A process sequence for the present embodiment is shown in FIGS. 7(A)-7(C). First, a silicon oxide film or silicon nitride film is formed as a buffer film 702 on a glass substrate 701.

Then, an active layer becoming a crystalline silicon film is formed. In FIG. 7(A), islands of region 703-705 form an active layer. As will become apparent later, regions indicated by 703, 704, and 705 become a drain region, a channel formation region, and a source region, respectively.

Subsequently, a silicon oxide film acting as a gate insulator film 706 is formed. Then, gate electrodes 707 and scanning lines (gate lines) 708 are formed, using a metal material or silicide material.

Under this condition, dopant ions are implanted to form the source region 705, drain region 703, and channel formation region 704 in a self-aligned manner.

A silicon nitride film is formed as a first interlayer dielectric film 709. Contact holes are formed in the first interlayer dielectric film 709 by a dry etching method.

Then, source electrodes or source interconnects 710 are formed from an appropriate metal material. A silicon nitride film is formed as a second interlayer dielectric film 711.

Thereafter, a contact hole 712 reaching the drain region 703 is formed by a dry etching method. In this way, a state shown in FIG. 7(A) is obtained.

After obtaining the state shown in FIG. 7(A), a black matrix (BM) material is deposited as a film. This black matrix material can be a titanium film, chromium film, or titanium/chromium lamination film.

This black matrix material film is patterned to form a black matrix, 713 and 715. At the same time, an electrode 714 in contact with the drain region 713 is formed. That is, the electrode 714 is made from the same material as the black matrix (FIG. 7(B)).

After obtaining the state shown in FIG. 7(B), a silicon nitride film is formed as a third interlayer dielectric film 716 that has the same film quality as both first interlayer dielectric film 709 and second interlayer dielectric film 711. This silicon nitride film has a thickness of 500 Å (FIG. 7(C)).

A contact hole reaching the electrode 714 is formed. A pixel electrode 717 is formed from ITO. A silicon nitride film is formed as a final protective film 718 (FIG. 7(C)).

In the configuration described in the present embodiment, the overlap between the black matrix 713 and the pixel electrode 717 form an auxiliary capacitor. The silicon nitride film has a high relative dielectric constant of about 6 to 7. Therefore, it is highly advantageous to use the third interlayer dielectric film 716 consisting of silicon nitride as the dielectric of a capacitor. The relative dielectric constant of the silicon oxide film is approximately 4.

Embodiment 4

The present embodiment is similar to Embodiment 3 except for the structure by which a black matrix is arranged on the TFT substrate. First, a silicon oxide film 702 is formed as a buffer layer on a glass substrate 701. Then, an active layer, 703-705, is formed. Subsequently, a silicon oxide film 706 acting as a gate insulator film is deposited.

A gate electrode 707 and a scanning line 708 are formed from an appropriate metal material or silicide material. Then, a silicon nitride film is deposited as a first interlayer dielectric film 709. Contact holes are formed in the first interlayer dielectric film 709 by a dry etching method. In the present embodiment, contact holes are formed in the source region 705 and in the drain region 703.

After forming the contact holes in the first dielectric film 709, a source electrode 710 and a drain electrode 800 are formed from the same constituent material.

Then, a silicon nitride film is deposited as a second interlayer dielectric film 711. A contact hole 801 is created in the second interlayer dielectric film by dry etching. During this processing step, the electrode 800 acts as an etch stopper.

In this way, a state shown in FIG. 8(A) is obtained. Then, a material forming the black matrix is deposited as a film and patterned to form black matrix portions 713, 715, as well as a portion 804 acting as an extractor electrode (FIG. 8(B)).

Then, a silicon nitride film is formed as a third interlayer dielectric film 716. A contact hole reaching the electrode 804 is created, followed by formation of pixel electrodes 717 of ITO. Then, a silicon nitride film 718 is formed as a final protective film (FIG. 8(C)).

Embodiment 5

The present embodiment relates to a structure in which a black matrix is arranged on a TFT substrate and pixel electrodes are in direct contact with drain regions.

A process sequence for the present embodiment is illustrated in FIGS. 9(A)-9(D). First, a silicon oxide film 902 is formed as a buffer film on a glass substrate 901. Then, an active layer, 903-905, is formed from a crystalline silicon film. Thereafter, a silicon oxide film 90 acting as a gate insulator film is deposited.

Gate electrodes 906 and scanning lines 907 are simultaneously formed from an appropriate metal material or silicide material. A silicon nitride film is formed as a first interlayer dielectric film 908.

After the formation of the first interlayer dielectric film 908, a contact hole for gaining access to each source region 903 is formed by a dry etching method. Each source electrode 909 is formed from an appropriate metal material.

After the formation of the source electrode 909, a silicon nitride film is deposited as a second interlayer dielectric film 910. In this way, a state shown in FIG. 9(A) is obtained.

Figure 9A:
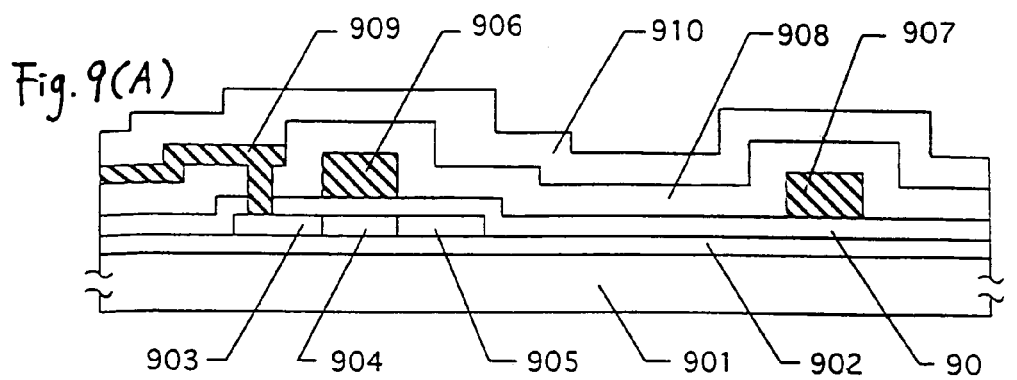
FIGS. 9(A)-9(D) are views illustrating processing steps for fabricating TFTs

After obtaining the state shown in FIG. 9(A), a black matrix (BM) film, 911 and 912, is formed from titanium or chromium or from a titanium/chromium lamination film. In this manner, a state shown in FIG. 9(B) is obtained.

Figure 9B:
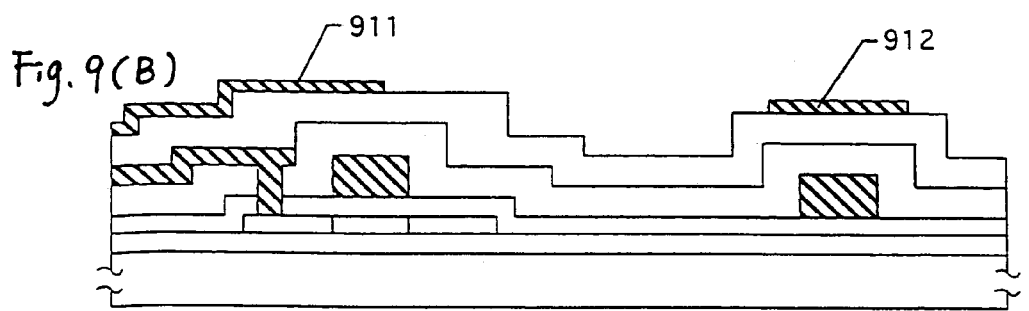
Figure 9C:
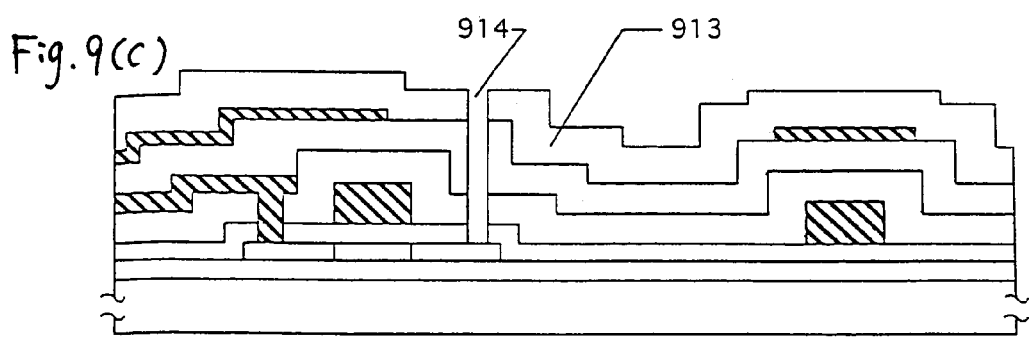
Figure 9D:
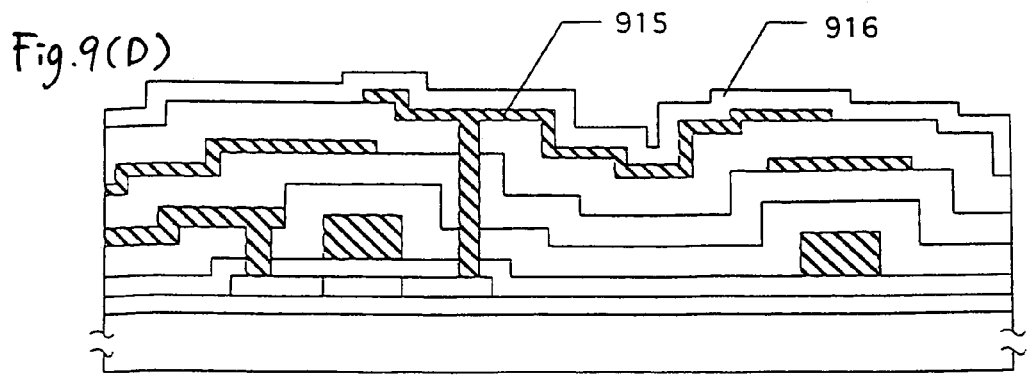

After obtaining the state shown in FIG. 9(B), a silicon oxide film or silicon nitride film is formed as a third interlayer dielectric film 913. Then, contact holes 914 are formed by a dry etching method, thus resulting in a state shown in FIG. 9(C).

Then, pixel electrodes 915 are formed from ITO. A silicon nitride film is deposited as a final protective film 916.

Also in the configuration described in the present embodiment, overlaps between each pixel electrode 915 and the black matrix film, 911 and 912, form capacitors whose dielectric is formed by the interlayer dielectric film 913.

Embodiment 5

The present embodiment relates to a structure comprising: an active layer made of a semiconductor; a silicon oxide film formed on the active layer; and a multilayer silicon nitride film formed on the first dielectric layer. The silicon oxide film acts as a gate insulator film. The silicon nitride film acts as an interlayer dielectric film. The multiple layers in the interlayer dielectric film are so designed that a lower layer has a higher etch rate.

A process sequence for the present embodiment is illustrated in FIGS. 1(A)-1(D), 2(A)-2(D), and 3(A)-3(B). The process conditions of the process sequence are similar to those of Embodiment 1 unless otherwise specified. The present embodiment is characterized in that interlayer dielectric films 107 and 111 made of silicon nitride have different etch rates.

In particular, the interlayer dielectric film 107 has a smaller etch rate, while the interlayer dielectric film 111 has a higher etch rate.

This can suppress the tendency of the diameter of each contact hole 112 to increase inwardly when it is created. That is, the tendency of the hole to assume a conical shape can be suppressed.

This structure is advantageous where interlayer dielectric films are formed in multiple layers and contact holes extending through the multiple layers are needed.

The difficulties with the manufacture of TFTs can be eliminated by the use of the invention disclosed herein. TFTs having stable characteristics can be obtained at a high production yield. Also, active matrix liquid crystal displays providing stable displays of high image quality can be fabricated at a high yield.

What is claimed:

1. A semiconductor device comprising:
   a substrate having an insulating surface;
   a thin film transistor formed on the insulating surface, the thin film transistor comprising a semiconductor layer and a gate electrode with a gate insulating film interposed therebetween;
   a scanning line over the substrate;
   a first interlayer insulating film comprising silicon nitride formed over the thin film transistor and the scanning line;

a source electrode formed over the first interlayer insulating film and electrically connected to the semiconductor film;

a second interlayer insulating film comprising silicon nitride formed over the first interlayer insulating film and the source electrode;

a pixel electrode formed over the second interlayer insulating film and electrically connected to the semiconductor film; and a third interlayer insulating film on and in contact with the second interlayer insulating film and the pixel electrode, wherein each of the first and second interlayer insulating films has an internal stress oriented in compressive direction and a variation of the internal stress in each of the first and second interlayer insulating films is within a range of ±50%.

2. The semiconductor device according to claim 1, wherein the third interlayer insulating film comprises silicon nitride.

3. The semiconductor device according to claim 1, wherein the thickness of the first interlayer insulating film is between 3000 and 5000 Å.

4. The semiconductor device according to claim 1, wherein the thickness of the second interlayer insulating film is between 2000 and 5000 Å.

5. The semiconductor device according to claim 1, wherein the pixel electrode comprises ITO.

6. A semiconductor device comprising:

a substrate having an insulating surface;

a thin film transistor formed on the insulating surface, the thin film transistor comprising a semiconductor layer and a gate electrode with a gate insulating film interposed therebetween;

a scanning line electrically connected to the gate electrode over the substrate;

a first interlayer insulating film comprising silicon nitride formed over the thin film transistor and the scanning line;

a source electrode formed over the first interlayer insulating film and electrically connected to the semiconductor film;

a second interlayer insulating film comprising silicon nitride formed over the first interlayer insulating film and the source electrode;

a pixel electrode formed over the second interlayer insulating film and electrically connected to the semiconductor film; and a third interlayer insulating film on and in contact with the second interlayer insulating film and the pixel electrode, wherein the absolute value of an internal stress of first and second interlayer insulating films is in $5 \times 10^9$ dyn/cm$^2$ or less.

7. The semiconductor device according to claim 6, wherein the internal stress is a compressive stress in both of the first and second interlayer insulating films.

8. The semiconductor device according to claim 6, wherein the third interlayer insulating film comprises silicon nitride.

9. The semiconductor device according to claim 6, wherein the thickness of the first interlayer insulating film is between 3000 and 5000 Å.

10. The semiconductor device according to claim 6, wherein the thickness of the second interlayer insulating film is between 2000 and 5000 Å.

11. The semiconductor device according to claim 6, wherein the pixel electrode comprises ITO.

* * * * *